United States Patent [19]
Wagner

[11] Patent Number: 5,179,302
[45] Date of Patent: Jan. 12, 1993

[54] TUNABLE DATA FILTER

[75] Inventor: Gary L. Wagner, Menlo Park, Calif.

[73] Assignee: Loral Aerospace Corp., New York, N.Y.

[21] Appl. No.: 679,626

[22] Filed: Apr. 3, 1991

[51] Int. Cl.[5] .............................. H03B 1/00; H03K 5/00
[52] U.S. Cl. ........................................ 307/521; 328/167
[58] Field of Search .............. 307/520, 521; 328/167; 333/173, 214; 375/99, 103

[56] References Cited

U.S. PATENT DOCUMENTS

| | | | |
|---|---|---|---|
| 3,559,081 | 1/1971 | Baudino | 328/167 |
| 3,638,037 | 1/1972 | McMurtrie | 307/520 |
| 3,766,480 | 10/1973 | Belloc et al. | 375/99 |
| 3,978,416 | 8/1976 | Sutphin, Jr. | 328/167 |
| 4,038,539 | 7/1977 | Van Cleave | 328/167 |
| 4,091,236 | 5/1978 | Chen | 328/167 |
| 4,207,543 | 6/1980 | Izakson et al. | 328/167 |
| 4,383,230 | 5/1983 | Manzolini | 333/214 |
| 4,413,240 | 11/1983 | Dyke | 307/521 |
| 4,716,388 | 12/1987 | Jacobs | 333/173 |
| 4,939,473 | 7/1990 | Eno | 307/521 |

Primary Examiner—Timothy P. Callahan
Attorney, Agent, or Firm—Dennis S. Fernandez; Edward J. Radlo

[57] ABSTRACT

An electronic data filter system (10), which functions as an approximation of a perfect matched filter, receives a conventional square-wave digital input signal (12) and outputs a filtered output signal (18). Output signal (18) appears as the summed integral of input signal (12). Filter system (10) includes a rate detector (50), which receives input signal (12) and provides a tuning voltage (16), and a data filter (30) which provides output signal (18). Data filter (30) includes, arranged in series, a notch filter (80) and a low-pass filter (90), wherein such filters (80, 90) contain capacitive-inductive circuits having certain value ratios which are tunable responsive to tuning voltage (16). Signal degradation of the filtered signal (12, 18) is minimized by filter system (10), which reduces the bit error rate (BER) and noise bandwidth of the filtered signal (12, 18). In one embodiment, data filters (30) are cascaded in parallel to extend data filtering bandwidth.

6 Claims, 4 Drawing Sheets

TUNABLE DATA FILTER

This is a subject invention under U.S. Government Contract #NAS5-33000, subcontract #F14000-J19513, and as such the Government has rights therein.

TECHNICAL FIELD

This invention relates to electronic filters and more particularly to voltage-tunable electronic filters employed to detect data in communication systems.

BACKGROUND ART

Electronic filters detect data, in part, by permitting data signals of predetermined frequencies or data rates to pass through the filter. Various active or passive elements having assigned electrical values are configured, sometimes in cascading sequence, in the filter to optimize the filter's data-detection ability. This optimization necessitates, however, that the filter be "tuned" to the predetermined frequencies or data rates.

Tuning is accomplished by precisely adjusting the relative balance of various inductive and capacitive values assigned to the filter elements. This fine-tuning of the various values can be difficult, especially when filtering data that are transmitted at very high frequencies, e.g., over 1,000 megabits/second.

Thus, to optimize filter data detection at such high data rates, the peak transient response of the data signal needs to be maximized, and its noise bandwidth needs to be minimized. Filter data-detection is improved by causing the filter to generate a voltage ramp output (i.e., a triangular pulse) in response to a digital signal input (i.e., a square pulse). In this way, the filter approximates a perfect matched filter, functioning as an integration over the input pulse period.

These improved filters, however, are not easily tunable due to the necessary fine-tuning of various values assigned to filter elements. Moreover, these improved filters do not readily permit optimum data detection at very high frequencies. Known improved approaches that employ switched-capacitor filters, for instance, are limited operationally only up to a few hundred kilohertz, due at least partly to inherent feedback in those filters.

U.S. Pat. No. 3,559,081 discusses an automatic gain-correcting filter, which is not frequency selective by tuning reactive elements.

U.S. Pat. No. 3,978,416 describes a frequency-tracking filter, which locks over a narrow noise bandwidth onto a noisy signal that is time-varying in the frequency domain.

U.S. Pat. No. 4,383,230 discloses a voltage-tuned active filter, operable only over 10 to 10,000 Hertz. The filter response is derived from feedback networks that allow the construction of simulated inductors.

U.S. Pat. No. 4,716,388 describes a switched capacitor filter, which employs feedback in the network, thereby being limited operationally only up to a few hundred kilohertz.

DISCLOSURE OF INVENTION

The present invention is a voltage-tunable data filter for filtering a digital waveform. The data filter comprises:

means for receiving (50) the digital waveform to produce a received signal (14);

coupled to said receiving means, means for producing a tuning voltage (16, 200) having a magnitude that is a function of the data rate of the received signal (14);

coupled to said receiving means (50), feedback-less filtering means (30, 30');  and means for tuning (99, 99') said filtering means (30, 30'), coupled to said filtering means (30, 30'), said tuning means (99, 99') causing said filtering means (30, 30') to minimize degradation of the received signal (14) when filtered at the data rate of the received signal (14).

BEST MODE FOR CARRYING OUT THE INVENTION

Figure 1:
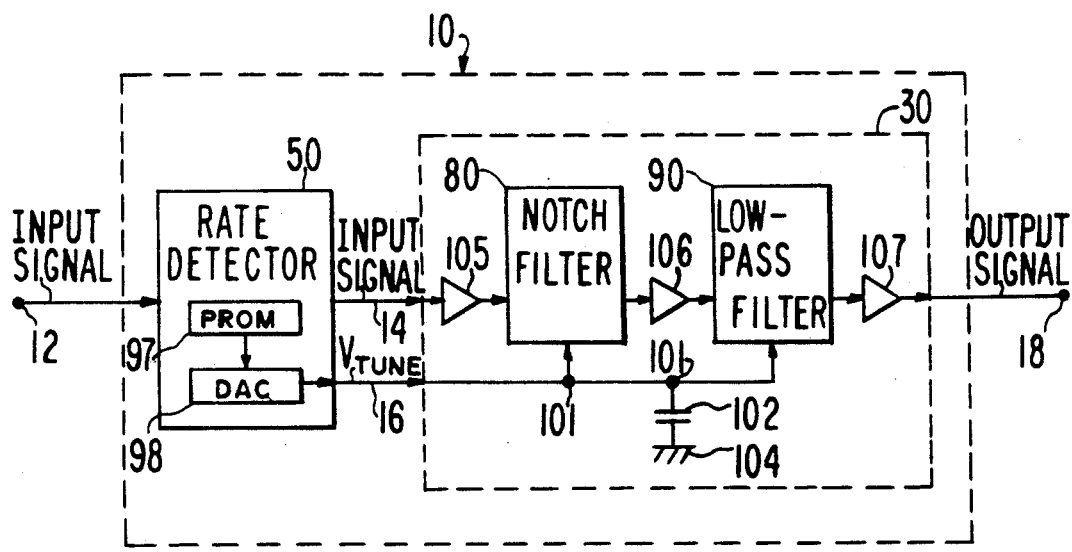
FIG. 1 is a block diagram of a filter system 10 for filtering an input signal 12 to provide an output signal 18.

Referring now to FIG. 1, a block diagram of filter system 10 is shown for filtering input signal 12 to provide output signal 18. Typically, input signal 12 is provided as a conventional digital signal, shaped as square-wave pulses. In filter system 10, input signal 12 is preferably provided in non-return-to-zero (NRZ) format, at rates from 1 megabit to over 1,000 megabits per second. Filter system 10 includes rate detector 50 and data filter 30.

Figure 3:
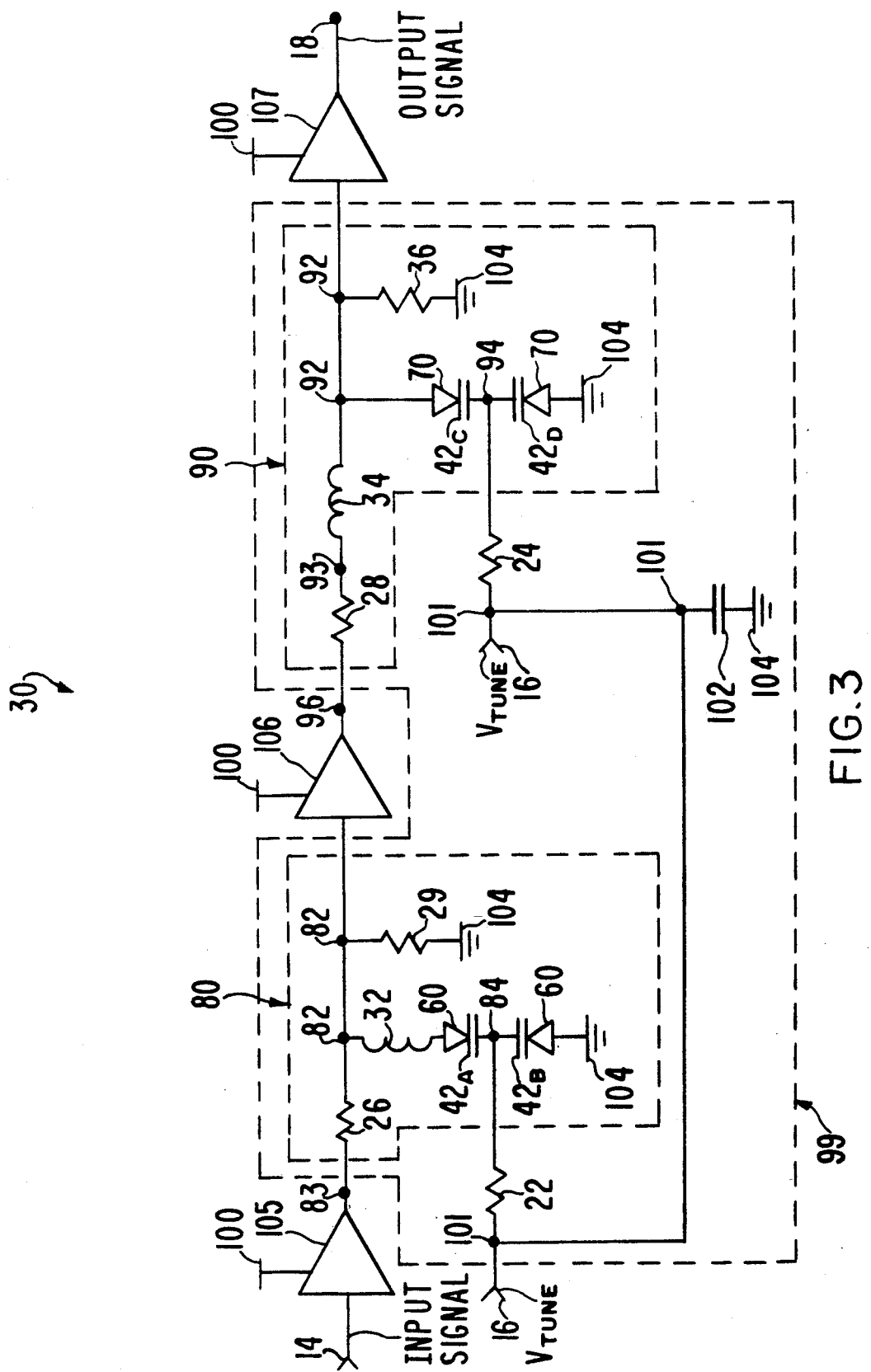
FIG. 3 is a schematic diagram of the data filter 30, of FIG. 1.

When operating, filter system 10 receives input signal 12 at rate detector 50. Rate detector 50, which may be separate or integral to data filter 30, is a conventional means for detecting the data rate of input signal 12. Rate detection is accomplished by: monitoring the data rate (or frequency) of input signal 12, comparing such rate or frequency against values stored in Programmable Read-Only Memory (PROM) 97, and sending those values that correspond with certain rate or frequency ranges to Digital-to-Analog Converter (DAC) 98 to generate tuning voltage 16. Rate detector 50 provides a tuning voltage 16 ($V_{tune}$) having a magnitude that is a function of the data rate of input signal 12. Rate detector 50 also provides, if necessary for alternative embodiments, a negative tuning voltage 200 having equal magnitude but opposite polarity of tuning voltage 16 ($V_{tune}$). Moreover, rate detector 50 allows input signal 12 to pass through substantially unaltered, thereby providing input signal 14. Preferably, the rate of change of the data rate of input signal 12 is sufficiently low that rate detector 50 generates, within typical detection delays, tuning voltage 16 corresponding to a data rate that temporally coincides with the data rate of provided input signal 14. Rate detector 50 applies tuning voltage 16 simultaneously at node 101 to cascaded filter sections 80, 90 in data filter 30, as shown in FIGS. 1 and 3.

Thus, input signal 14 and tuning voltage 16 are received by data filter 30, which produces output signal 18. Data filter 30, which is illustrated in further detail in FIG. 3, contains notch filter 80 and low-pass filter 90, which are cascaded serially. Notch filter 80 is comprised of resistor 26, inductor 32, voltage-tunable variable capacitors 42A and 42B, and resistor 29. Low-pass filter 90 is comprised of resistor 28, inductor 34, voltage-tunable variable capacitors 42C and 42D, and resistor 36. Furthermore, notch filter 80 and low-pass filter 90, combined with resistor 22 and 24 and bypass capacitor 102, as shown in FIG. 3, comprise tuning circuit 99.

Input signal 14 is received by buffer 105 and further received by notch filter 80. Notch filter 80 outputs through buffer 106 to pass the notch-filtered signal 14 to low-pass filter 90, and then through buffer 107. Tuning voltage 16, produced by rate detector 50, is applied at node 101 in parallel to notch filter 80 and low pass filter 90, through resistors 22 and 24 respectively. Bypass capacitor 102 is connected at node 101 to tuning voltage 16, serving to eliminate signal-frequency parasitics between low-pass filter 90 and notch filter 80 by shorting such high frequency signals to ground 104. Bypass capacitor 102 is assigned a capacitance value appropriately, i.e., a few microfarads, such that the impedance at high signal frequencies is relatively small compared to signals that are bypassed.

Figure 2:
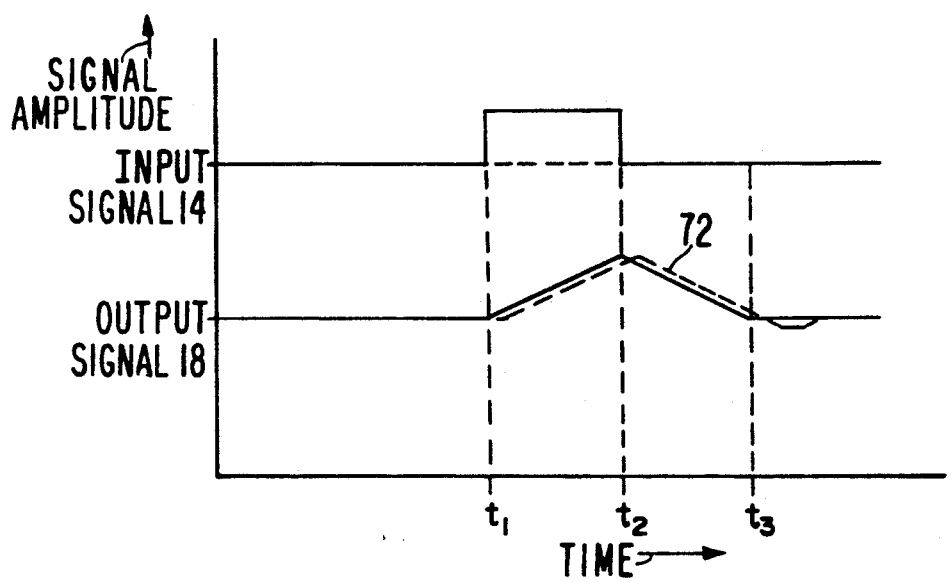
FIG. 2 is a timing diagram showing, as a fuction of time, the amplitudes of input signal 12 and output signal 18, corresponding to FIG.1.

In FIG. 2, a timing diagram 20 illustrates the transient behavior of data filter 30 by showing the relative signal amplitudes, roughly in scale, of representative input signal 14 and output signal 18. Thus, in this example, at time $t_1$, input signal 14 amplitude rises as a step function through time $t_2$. At time $t_2$, input signal 14 amplitude drops negatively through time $t_3$. In NRZ format, input signal 14 may be a logical "high" from times $t_1$ to $t_2$ and a logical "low" from times $t_2$ to $t_3$. Typically, times $t_1$ through $t_2$ represent one bit period.

Data filter 30 functions as an approximation of a perfect matched filter by integrating input signal 14 over its pulse period, i.e., from times $t_1$ to $t_2$. Output signal 18 appears, therefore, as the summed function of input signal 14, as shown by the triangular ramp of output signal 18. Of course, output signal 18 depicts an ideal perfect matched filter resulting from calculated integration. In reality, however, due to factors such as overshoot and ringing, output signal 18 amplitude behaves generally as shown by output ramp 72. Based on the assigned values of various elements in data filter 30, as configured presently, output ramp 72 exhibits some delay and amplitude reduction; although overall degradation of less than 0.25 dB has been achieved over monitored input signal 12 frequencies. Generally, degradation is minimized by reducing signal bit error rate (BER) and noise bandwidth.

In FIG. 3, a schematic diagram of data filter 30 is shown. Of course, electrical equivalents of portions of data filter 30 may be employed to achieve similar or equivalent filtering functionality. When operating, input signal 14 is received by buffer 105. Buffers 105, 106, 107 serve to provide impedance isolation of notch filter 80 and low-pass filter 80. Each buffer 105, 106, 107, each of which is tied to power supply 100, provides substantially infinite input impedance and substantially zero output impedance. Although still functional without using buffers 105, 106, 107, data filter 30 preferably employs buffers 105, 106, 107 to keep internal impedances of data filter 30 well-defined.

Buffered input signal 14 then passes through node 83 and resistor 26 normalized at one ohm. Inductor 32, having a normalized value of 0.1464 henry, is connected at node 82 to resistor 26. Resistor 29, having a normalized value of one ohm, is also connected at node 82 to resistor 26, and then tied to ground 104. Variable capacitors 42A and 42B are arranged in series between node 82 and ground 104 The effective capacitances of variable capacitors 42A and 42B, as connected at node 84, vary proportionately with multiplier K X the normalized capacitance of 0.193 farad, where K is the ratio of the capacitance of variable capacitors 42A and 42B when tuning voltage 16 is applied for a particular input signal 12 data rate to the capacitance of those capacitors 42A and 42B when the input signal 12 data rate is normalized, at 1 bit per data period.

Resistor 22, assigned a 100 kilo-ohm value, and connected at node 84, serves to isolate tuning voltage 16 from power supply 100. Resistor 22 may be assigned a value sufficiently small so that leakage currents through diodes 60 in variable capacitors 42A and 42B do not substantially affect bias voltage in these diodes 60. In addition, resistor 22 should be assigned a value large enough so that the loss of notch filter 80 is substantially unaffected. As configured in notch filter 80, inductor 32 and variable capacitors 42A and 42B contribute two poles and two zeros toward the transfer function of data filter 30.

The output of notch filter 80 at node 82 is then received by buffer 106 and passed on to low-pass filter 90 through node 96 to normalized resistor 28, having a value of one ohm, which functions similarly to resistor 26. Resistor 28 is connected serially at node 93 to inductor 34, which is assigned a normalized value of 0.5769 henry. Inductor 34 is then connected at node 92 to variable capacitors 42C and 42D, arranged serially about node 94 therebetween and then to ground 104. As similarly specified before for variable capacitors 42A and 42B, variable capacitors 42C and 42D provide effective capacitance at node 94 that varies proportionately with multiplier K $\times$0.193 farad, where K is the ratio of the capacitance of variable capacitors 42C and 42D when tuning voltage 16 is applied for a particular input signal 12 data rate to the capacitance of those capacitors 42C and 42D when the input signal 12 data rate is normalized, preferably at 1 bit per data period.

Resistor 36, assigned a normalized value of 0.864 ohm value, ties node 92 to ground 104. Resistor 24, preferably assigned a 100 kilo-ohm value, is connected between node 94 and tuning voltage 16 to reduce, similarly as with resistor 22, leakage currents that affect bias voltage. Resistor 24 also serves to leave low-pass filter 90 loss substantially unaffected. The output of low-pass filter 90 at node 92 is then passed through buffer 107 to produce output signal 18. As configured in low-pass filter 90, inductor 34 and variable capacitors 42C and 42D additionally contribute two poles toward the transfer function of data filter 30, which has a total of 4 poles and 2 zeros.

In accordance with an important aspect of the present invention, the ratio of the inductance of inductor 32 to that of inductor 34 must be fixed and maintained at a predefined value, preferably about 0.25. This ratio permits data filter 30 to be tuned to operate optimally, i.e., with minimum signal degradation, by merely applying tuning voltage 16 simultaneously to voltage-tunable variable capacitors 42A–D. Moreover, such optimal tuning is accomplished by tuning circuit 99, which operates in a feedback-less configuration to reduce bit error rate and noise bandwidth, particularly at high input signal 14 frequencies.

Figure 4:
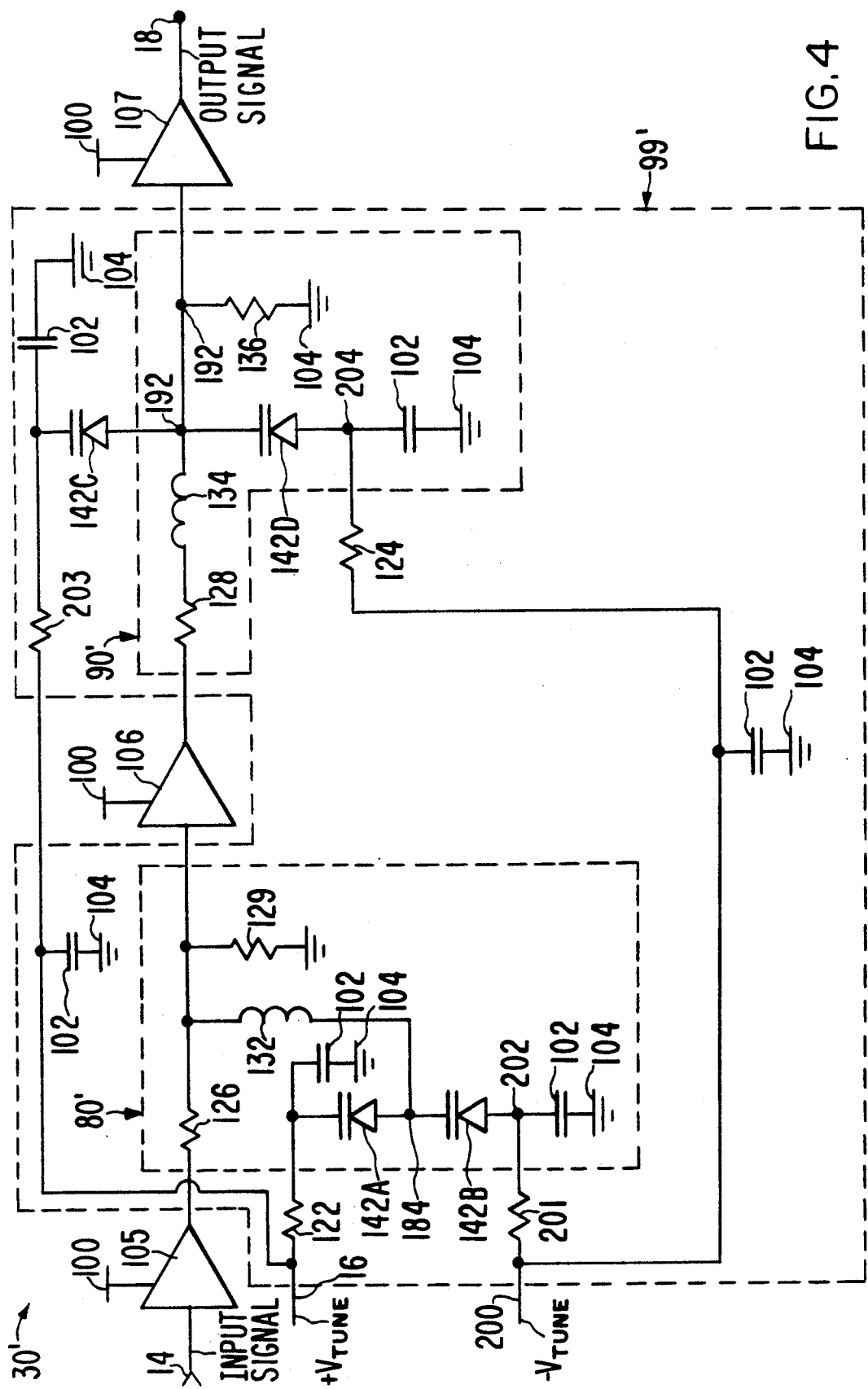
FIG. 4 is an alternate embodiment of the data filter 30 of FIG. 1, using ±/− tuning voltages 16, 200.

FIG. 4 shows data filter 30' which serves an alternative embodiment of data filter 30. Data filter 30' is tuned with positive and negative tuning voltages 16, 200, where positive tuning voltage 16 is a function of the data rate of input signal 14, and negative tuning voltage 200 is of equal magnitude but opposite polarity to voltage 16.

Similarly to data filter 30, data filter 30' employs serially-cascaded notch filter 80' and low-pass filter 90'. In addition, buffers 105, 106, 107, each tied to power supply 100, are employed for impedance isolation purposes, as before for data filter 30. Likewise, bypass capacitors 102, having preferably assigned values of a few microfarads, are coupled, as shown in FIG. 4, to data filter 30' to eliminate high frequency parasitics.

Unlike data filter 30, which only employs a single tuning voltage 16, data filter 30' accomplishes filter tuning of input signal 14 frequency by using positive tuning voltage 16 and negative tuning voltage 200. This approach provides improved voltage balancing to control the effective capacitances of variable capacitors 142A-D, i.e., at nodes 184 and 204 in notch filter 80' and low-pass filter 90' respectively.

Notch filter 80' comprises, as shown connected in FIG. 4, resistor 126 (having a one ohm normalized value), resistor 129 (having a one ohm normalized value), inductor 132 (having a 0.464 henry normalized value), variable capacitors 142A and 142B (preferably having effective normalized capacitance values, at node 184, of K ×0.143 farad, where K is equivalent to the ratio that was calculated previously for data filter 30), and bypass capacitors 102 tied to ground 104.

Low-pass filter 90' comprises, as shown connected in FIG. 4, resistor 128 (having a one ohm normalized value), inductor 138 (having a 0.5769 henry normalized value), resistor 136 (having a 0.864 ohm normalized value), variable capacitors 142C and 142D (preferably having effective normalized capacitance values, at node 192, of K ×0.143 farad, where K is equivalent to the ratio that was calculated previously for data filter 30), and bypass capacitors 102 tied to ground 104. Of course, electrical equivalents of the circuitry in filter sections 80' and 90', allow one skilled in the art to assign values that are different from these preferred values.

When operating, input signal 14 is received by buffer 105 and passed to notch filter 80'. From notch filter 80', the notch-filtered signal 14 is received by buffer 106, passed to low-pass filter 90', and then received by buffer 107 to produce output signal 18.

Filter sections 80, and 90' are tuned to minimize filtered signal 14 degradation by applying tuning voltages 16, 200, which are functions of the data rate of input signal 14. Tuning circuit 99' comprises filter sections 80' and 90' and resistors 122, 201, 124, and 203, where each resistor, preferably having a 100 ohm value, functions similarly to resistors 22, 24 of data filter 30. Thus, similarly to the tuning operation in data filter 30, tuning voltages 16, 200 are simultaneously applied to filter sections 80' and 90' to achieve minimum signal degradation, i.e., by reducing bit error rate (BER) and noise bandwidth. As in data filter 30, data filter 30' is configured similarly without feedback, i.e., such that input signal 14 is passed on from buffer-to-notch filter-to-low-pass filter-to-buffer, to produce output signal 18. Moreover, as before, the ratio of the inductance of inductor 132 in notch filter 80' to that of inductor 134 in low-pass filter 90' is preferably maintained at a value that is substantially equal to 0.25.

Figure 5:
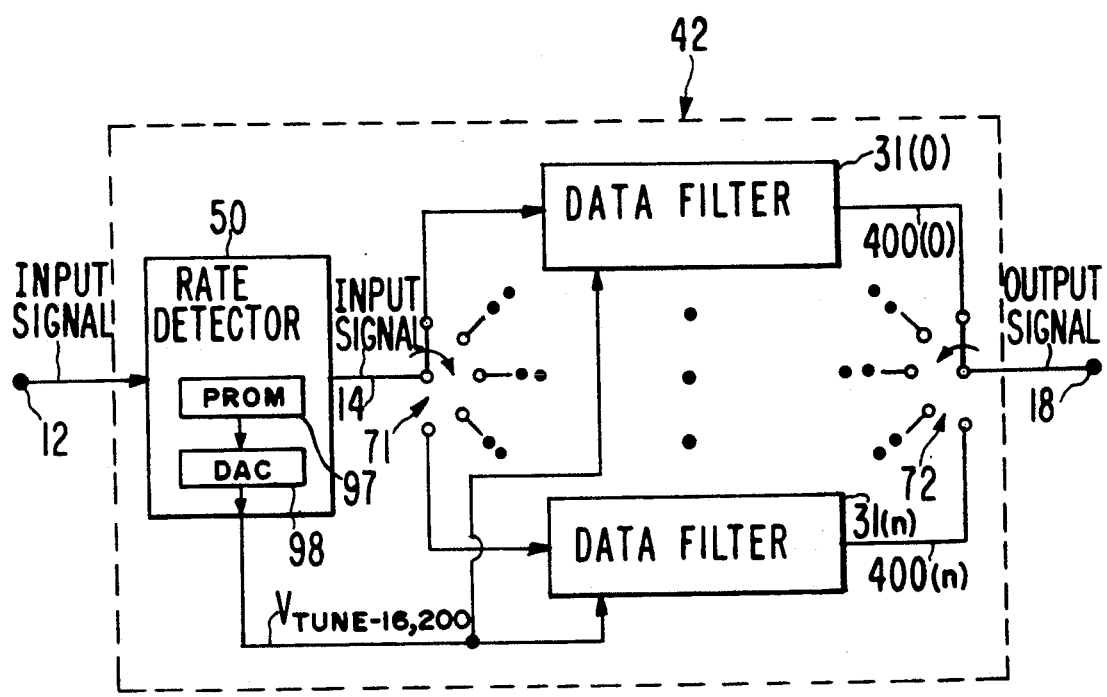
FIG. 5 is a block diagram of an alternative filter system 42, showing cascaded data filters 31 for extended frequency applications.

FIG. 5 shows a block diagram of an alternative filter system embodiment 42 having data filters 31(o) through 31(n), where n is any positive integer. Data filters 31 are cascaded in parallel to achieve filtering functionality over extended frequencies or data rate bandwidth. Preferably, each data filter 31 is configured to operate optimally, i.e., with minimum signal 14 degradation, within predefined data rate ranges. In this cascaded arrangement, input signal 12 is received, similarly to filter system 10, by rate detector 50, which provides to each data filter 31 input signal 14, tuning voltage 16, and if appropriate, as shown in FIG. 4, tuning voltage 200. Rate detector 50, similarly to the embodiment of FIG. 1, employs PROM 97 and DAC 98 to provide tuning voltage 16, and if appropriate, tuning voltage 200, simply by inverting tuning voltage 16. Each data filter 31 receives input signal 14, through switch 71, from rate detector 50.

Switch 71 functions to switch input signal 14 to a data filter 31 that is configured to filter input signal 14 at the data rate at which such signal 14 is received. Switch 71 is therefore responsive to tuning voltage 16, 200, which is generated by rate detector 50. Switch 72 functions to combine various output signals 400(o) through 400(n), by switching to the signal 400 presently passing through, to produce output signal 18.

The above description is included to illustrate the operation of the preferred embodiments and is not meant to limit the scope of the invention. The scope of the invention is to be delimited only by the following claims. From the above discussion, many variations will be apparent to one skilled in the art that would yet be encompassed by the true spirit and scope of the invention.

I claim:

1. Apparatus for filtering a digital waveform, said apparatus comprising:

coupled to said digital waveform, means for producing a tuning voltage having a magnitude that is a function of a data rate of the digital waveform; and coupled to said producing means, means for filtering said digital waveform to produce a filtered digital waveform;

wherein said filtering means comprises:

a notch filter coupled to said digital waveform; and a low-pass filter, coupled to said notch filter;

wherein said notch filter and said low-pass filter each comprise at least one voltage-tunable capacitance; and said tuning voltage is applied simultaneously to each voltage-tunable capacitance to minimize degradation of the digital waveform, thereby reducing a bit error rate and a noise bandwidth of the digital waveform.

2. The apparatus of claim 1, wherein said filtering means further comprises:

an inductance circuit in each of said notch filter and said low-pass filter, each inductance circuit coupled to a voltage-tunable capacitance, wherein the ratio of the inductance of said inductance circuit in said notch filter to the inductance of the inductance circuit in said low-pass filter is maintained at a predefined value.

3. The apparatus of claim 2, wherein said value is substantially equal to 0.25.

4. The apparatus of claim 2, wherein said inductance circuits and said voltage-tunable capacitances configure said filtering means into a 4-pole, 2-zero transfer function.

5. The apparatus of claim 1, further comprising:

coupled between said filtering means and ground, bypass means, for minimizing high-frequency parasitics.

6. The apparatus of claim 1, further comprising: coupled between said notch filter and said low-pass filter, buffer means, for providing impedance isolation between said notch filter and said low-pass filter, said buffer means having a high input impedance and a low output impedance.

* * * * *